United States Patent [19]

Kitagawa et al.

[11] Patent Number: 4,576,475

[45] Date of Patent: Mar. 18, 1986

[54] CONTACTING METHOD AND APPARATUS IN CONTACT COPYING

[75] Inventors: Takahiro Kitagawa, Yokohama; Masao Totsuka, Ohmiya, both of Japan

[73] Assignee: Canon Kabushiki Kaisha, Tokyo, Japan

[21] Appl. No.: 756,568

[22] Filed: Jul. 18, 1985

Related U.S. Application Data

[63] Continuation of Ser. No. 480,829, Mar. 31, 1983, abandoned.

[30] Foreign Application Priority Data

Apr. 5, 1982 [JP] Japan .................................. 57-56322

[51] Int. Cl.⁴ ...................... G03B 27/20; G03B 27/02
[52] U.S. Cl. ......................................... 355/91; 355/132
[58] Field of Search ..................................... 355/91–94, 355/78, 87, 132

[56] References Cited

U.S. PATENT DOCUMENTS

| | | | |
|---|---|---|---|
| 3,547,537 | 12/1970 | Betron | 355/94 X |
| 3,645,622 | 2/1972 | Cachon et al. | 355/94 X |
| 3,705,769 | 12/1972 | Johannsmeier | 355/78 X |
| 3,955,163 | 5/1976 | Novak | 355/91 X |
| 4,087,181 | 5/1978 | Alexander et al. | 355/92 |
| 4,179,110 | 12/1979 | Kosugi et al. | 355/78 X |
| 4,218,136 | 8/1980 | Komoriya et al. | 355/91 X |

*Primary Examiner*—L. T. Hix
*Assistant Examiner*—D. Rutledge
*Attorney, Agent, or Firm*—Fitzpatrick, Cella, Harper & Scinto

[57] ABSTRACT

A contacting method comprises the steps of holding a photomask and a wafer at a predetermined interval, curving at least one of the photomask and the wafer so as to form a convexity relative to the other, and moving the photomask and the wafer relative to each other to bring them into intimate contact with each other.

2 Claims, 8 Drawing Figures

CONTACTING METHOD AND APPARATUS IN CONTACT COPYING

This application is a continuation of application Ser. No. 480,829 filed Mar. 31, 1983, now abandoned.

BACKGROUND OF THE INVENTION

1. Field of the Invention

This invention relates to a contacting method in contact printing, such as, for example, a contacting method in which a photomask (mask) and a wafer are set in a predetermined relation in a step of bringing the mask and the wafer into intimate contact with each other and in which a pattern on the mask is printed on the wafer in the manufacture of semiconductor.

2. Description of the Prior Art

In a method of this type, the mask and wafer are held at a suitable interval, whereafter a vacuum is created in closed space formed between the mask and the wafer and atmospheric pressure is caused to act on the back of the mask, whereby the mask is bent toward the wafer side to thereby bring the mask and the wafer into intimate contact with each other. In this case, the initially set gap between the mask and the wafer has greatly affected the intimacy of the contact between the mask and the wafer.

That is, when the gap amount is set to a small value, the amount of flexure (the amount of curvature) of the mask is small. Therefore, good intimate contact is provided in the marginal portion of the mask and the so-called pitch error is small. The pitch error is a phenomenon that the patterned surface of the mask becomes lengthened by curvature of the mask and the mask pattern is printed on the wafer at a location thereon that deviates from the position whereat the mask pattern should be printed.

However, there has also been a problem that when relatively wide areas of the mask and wafer begin intimate contact with each other, the gas present near the central portion (for example, $N_2$ gas or the like for protecting negative resist) is cut off from escape and shut in thereby causing deterioration of intimacy of the contact in the central portion. It is possible to wait for the escape of the gas, but this method would offer a problem in respect of the through-put of production. The poor intimacy of the contact in a minute gap generally leads to reduced resolving power due to diffraction of light.

On the other hand, when the gap amount is set to a great value, the mask bends greatly and begins to make intimate contact with the wafer from a small area near the central portion thereof. Due to the increased degree of vacuum, this area tends to gradually widen toward the marginal portion, whereby the above-described phenomenon in which the gas is shut in near the central portions of the mask and wafer during the intimate contact thereof is alleviated and the intimacy of the contact in the central portions is improved.

In this case, however, the mask is greatly bent over toward the wafer side and curved during the intimate contact thereof. Leads to a problem that due to the rigidity of the mask, the mask and wafer do not make intimate contact with each other in the marginal portions thereof. Therefore, the degree of intimate contact in the marginal portions is reduced to aggravate the quality of image and accordingly the chip collection rate in the marginal portions is reduced. Also, the fact that the mask is greatly curved toward the wafer during the intimate contact therebetween leads to a problem that the afore-mentioned phenomenon of pitch error becomes pronounced.

SUMMARY OF THE INVENTION

It is a first object of the present invention to provide good intimate contact between two bodies and enhance the degree of intimate contact particularly at the marginal portions thereof.

It is a second object of the present invention to realize intimate contact between two bodies without shutting gas in the central portions thereof.

It is a third object of the present invention to suppress the pitch error.

It is a fourth object of the present invention to bring a mask provided with an integrated circuit pattern and a wafer into intimate contact with each other and to transfer a good image of the integrated circuit pattern onto the wafer.

The invention will become fully apparent from the following detailed description thereof taken in conjunction with the accompanying drawings.

DESCRIPTION OF THE PREFERRED EMBODIMENTS

Figure 1:
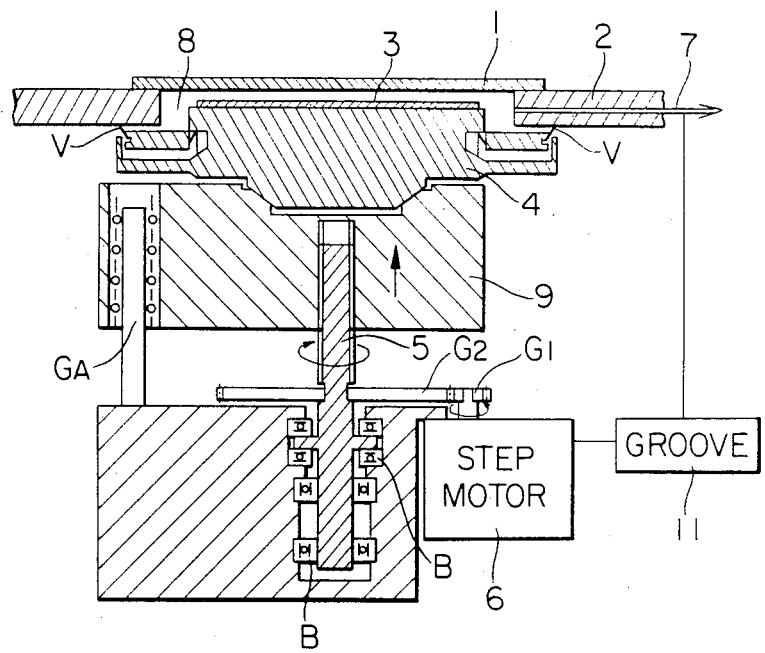
FIG. 1 is a cross-sectional view showing a specific embodiment of the present invention.

Referring to FIG. 1 which shows the mask chuck and wafer chuck of a mask aligner and a driving device, reference numeral 1 designates a mask, reference numeral 2 denotes a mask holder, reference numeral 3 designates a wafer, reference numeral 4 denotes a wafer chuck rigidly holding the wafer and reference numeral 5 designates a feed screw which is threadably engaged with a female screw of a member 9, to be described, to constitute a mechanism for converting rotational movement into rectilinear movement. Designated by 6 is a step motor. Revolution of the step motor 6 is transmitted to the feed screw 5 via a gear train G1, G2. Denoted by 7 is a conduit for evacuating a vacuum chamber 8. The conduit 7 is connected to a vacuum pump, not shown. Reference numeral 9 designates a member which is vertically movable by rotation of the feed screw 5 while rigidly holding the wafer chuck 4 against rotation. Letter B denotes bearings and letters GA designates a guide.

Figure 2A:
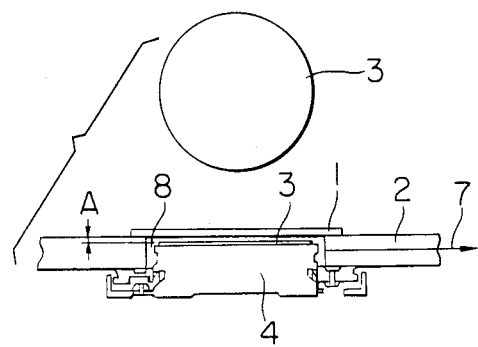
FIGS. 2A–2D are cross-sectional views illustrating the steps through which intimate contact of a mask and wafer is achieved.

Now, the mask 1 and the wafer 3 are first set at predetermined positions by a well-known means. At this time, a closed space (vacuum chamber 8) is formed between the mask and the wafer, but a vacuum is not yet created therein. Designated by V is a seal plate for hermetically sealing the vacuum chamber. Subsequently, the mask 1 and the wafer 3 are aligned by an X·Y·$\theta$ movable stage, now shown. Thereafter, the feed screw 5 is rotated by the step motor 6 to move the vertically movable member 9 upwardly (or downwardly). At the same time, the wafer chuck 4 rigidly fixed to the vertically movable member 9 is moved upwardly (or downwardly) while holding the wafer 3 and finally, the wafer 3 is set at a position spaced apart by a predetermined gap relative to the mask 1 and is rigidly fixed thereat. This state is shown in FIG. 2A. In FIG. 2A, letter A indicates a gap amount provided between the mask and the wafer. This gap amount A is set to a value greater than that in the prior art. That is, the gap amount is greater than the added values of the degrees of flatness (the difference between the highest surface and the lowest surface) of the mask and wafer.

Figure 2B:
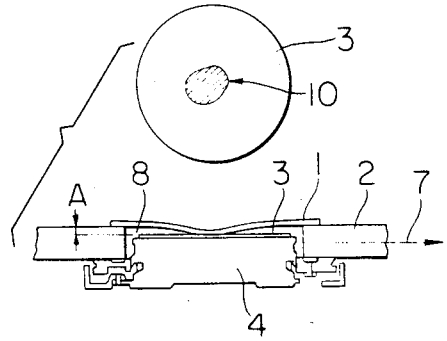
Figure 2C:
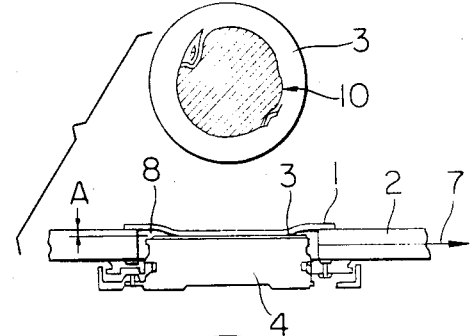
Figure 2D:
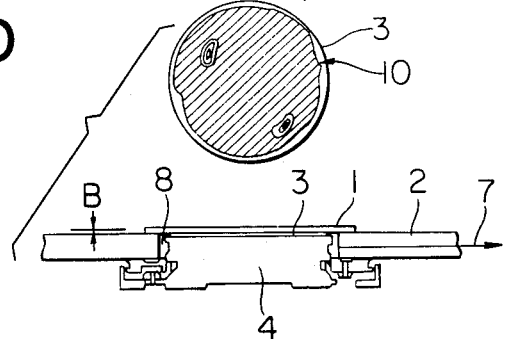

The vacuum chamber 8 is then evacuated through the conduit 7, whereby intimate contact between the mask and the wafer begins to take place. In this case, the initial gap A between the mask and the wafer is great. Therefore, the mask is greatly curved toward the wafer side and the mask and wafer, even if more or less poor in their flatness, begin to make intimate contact with each other from a small area near the center thereof. This state is shown in FIG. 2B. In FIG. 2B, reference numeral 10 designates the area of intimate contact which may be observed as a 0-order interference fringe through a microscope, not shown. As the vacuum pressure is further increased, the mask 1 is attracted toward the wafer 3 with the result that the area of intimate contact 10 is enlarged. FIG. 2C shows the state of intimate contact when the initial gap amount between the mask and the wafer is A. In the course of progress from the state of FIG. 2B to the state of FIG. 2C, the mask is greatly curved downwardly convexly and therefore, the gas shut-in phenomenon is not liable to occur. Accordingly, a better state of intimate contact is obtained. In this state, however, the degree of intimate contact in the marginal portion of the wafer is low due to the great initial gap amount between the mask and the wafer and the rigidity of the mask. For this reason, the feed screw 5 is rotated by the step motor 6 of FIG. 1, whereby the wafer 3 held on the wafer chuck 4 is moved upwardly through the intermediary of the vertically movable member 9 until the gap amount between the mask 1 and the wafer 3 becomes minute. As a result, the flexure of the mask can be eliminated and the degree of intimate contact in the marginal portion of the wafer can be increased. This state is shown in FIG. 2D. In FIG. 2D, the minute gap amount B is the difference between the initial gap amount A and the amount by which the wafer has been moved upwardly by the use of the step motor 6. It is not always when B is zero that the flexure of the mask is zero. In this state, the mask having a pattern thereon can eventually keep predetermined flatness necessary for contact printing. Thereafter, an exposure light is applied. Designated by 11 is a controller which actuates the step motor 6 when the atmospheric pressure in the vacuum chamber 8 has been reduced and the mask 1 has flexed by a predetermined amount.

In the present embodiment, the wafer is moved upwardly after the vacuum pressure between the mask and the wafer has reached a predetermined pressure, but alternatively the wafer may be moved upwardly in the course of change of the vacuum pressure. That is, a second step may be initiated before a first step is terminated. Also, the speed at which the wafer is moved upwardly can be changed as desired if, in FIG. 1, the pulse frequency applied to the step motor 6 is varied.

In the present embodiment, a motor and a mechanism for converting rotational movement into rectilinear movement are used to vertially move the wafer held on the wafer chuck. However, the present invention is not restricted thereto but may have a mechanism capable of changing the gap between the mask and the wafer as desired.

Also, in the present embodiment, the intimate contact between the mask and the wafer is accomplished by creating a vacuum in the space therebetween to thereby attract the mask toward the wafer side. However, alternatively the back of the mask may be pressed to thereby curve the mask downwardly convexly and bring the mask into intimate contact with the wafer.

It is also conceivable to use the present invention with other systems, for example, such as the system as described in Applicant's Prior Japanese Patent Application No. 215335/1981 wherein the degree of intimate contact between the mask and the wafer is enhanced by gradually increasing the vacuum pressure between the mask and wafer.

Figure 3:
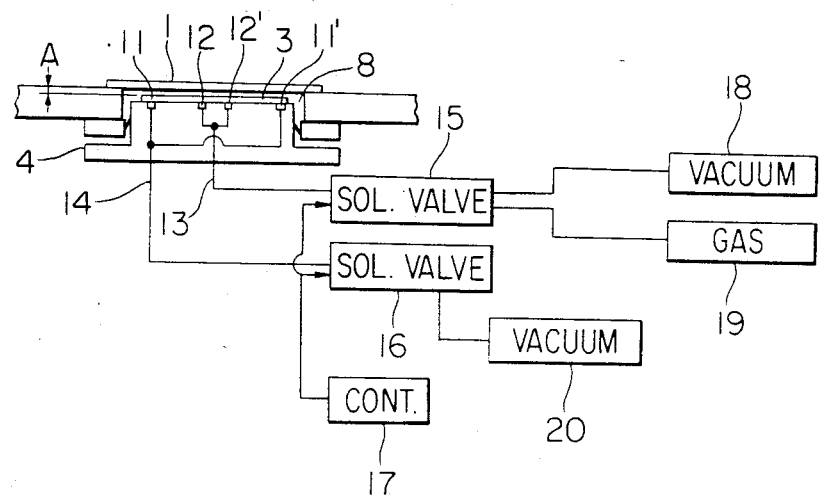
FIG. 3 is a partially diagrammatic and partially schematic view showing another specific embodiment of the present invention.

FIG. 3 shows another embodiment for curving the wafer.

In FIG. 3, reference numerals 1 to 10 designate members identical to those described above. Reference numerals 11 and 11' denote adsorbing grooves provided on the wafer chuck and disposed along the outer periphery thereof. Reference numerals 12 and 12' designate adsorbing grooves similar to 11 and 11' but disposed in the central portion of the wafer chuck. Designated by 13 and 14 are conduits for connecting the adsorbing grooves 11 and 12 to the outside of the wafer chuck. The conduit 13 communicates with a vacuum or gas through the change-over of an electromagnetic valve 15 under control of a control device 17. Reference numeral 18 designates a vacuum source and reference numeral 19 denotes a compressed gas source (for example, $N_2$ gas source). The conduit 14 communicates with a vacuum source 20 through an electromagnetic valve 16.

In FIG. 3, the wafer 3 has its back attracted by a vacuum-created by the vacuum sources (here, the central portion and marginal portion thereof being separated by the vacuum sources 18 and 20, respectively) while, on the other hand, the mask 1 is rigidly fixed with a gap amount A between the wafer 3 and the mask 1 which is greater than the usual gap amount, as in the embodiment described in connection with FIG. 2.

Figure 4A:
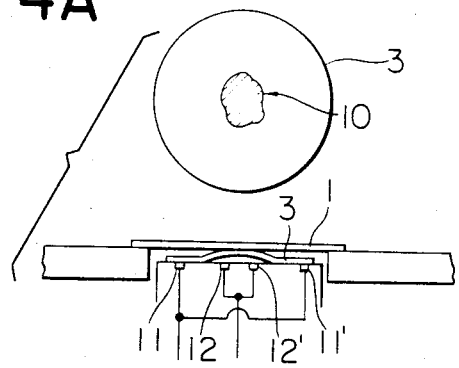
FIGS. 4A and 4B are cross-sectional views illustrating the two steps through which intimate contact of a mask and wafer is achieved.
Figure 4B:
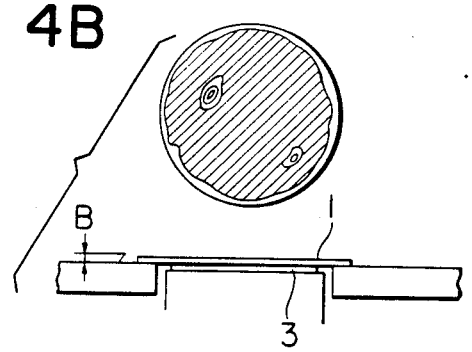

Subsequently, the electromagnetic valve 15 is changed over by the instruction from the control device 17 so that, as shown in FIG. 4A, compressed gas is passed into the central adsorbing grooves 12 and 12', of the adsorbing grooves to which the wafer 3 is fixed. The central portion of the back of the wafer is curved slightly convexly with the marginal portion thereof remaining absorbed at grooves 11 and 11' the central portion is thus brought into intimate contact with the mask 1. When, as shown in FIG. 4B, the wafer chuck 4 is then pushed up toward the mask side so as to decrease the gap amount A, the area of intimate contact spreads to the marginal portion without trapping any gas in the central portion. Whether the mask 1 is pushed and curved by the wafer 3 at this time is determined by the rigidity of the mask and wafer and the pressure of the compressed gas, which can be adjusted by a compressed gas pressure adjusting device, not shown.

After or in the course of said adjustment, as in the previous embodiment, a vacuum can be created in the space between the mask and the wafer or the back of the mask may be pressed to enhance the state of intimate contact. Further, the marginal adsorbing grooves 11 and 11' may be changed over from vacuum to compressed gas blow-up by change-over of an electromagnetic valve.

According to the present invention, as described above, there can be simply obtained a good state of intimate contact without deterioration of the intimate contact of the marginal portion, without occurrence of any pitch error resulting from bending of the mask and without occurrence of the gas shut-in phenomenon.

If the alignment accuracy is within the target valve, the mask pattern will be printed on the wafer by an exposure optical system.

The present invention is not restricted to the above-described embodiments, but other embodiments in which, for example, the central portion of the back of the mask is pressed from the back and then the wafer is pushed up toward the mask side, are conceivable without departing the scope of the present invention.

The present invention is useful in the field of semiconductor printing in, for example, a mask aligner or the like, whereas it is not restricted to such field but may also be used in other fields which require contact printing.

What we claim is:

1. A method of bringing a mask and a wafer into intimate contact, said method comprising the steps of:
    holding a marginal portion of the mask on a mask holder;
    holding a wafer on a wafer chuck;
    locating the mask holder and the wafer chuck so that the mask and wafer are out of contact;
    exhausting gas from between the mask and the wafer while substantially preventing relative movement between the mask holder and the wafer chuck and concurrently permitting atmospheric pressure to act on a surface of the mask at its side opposite to the wafer thereby to cause the mask to become convex relative to the wafer; and
    thereafter moving the mask holder and the wafer chuck relative to each other thereby to bring the mask and the wafer into intimate contact with each other.

2. A method of bringing a mask and a wafer into intimate contact, said method comprising the steps of:
    holding the mask on a mask holder;
    holding a marginal portion of the wafer on a wafer chuck;
    locating the mask holder and the wafer chuck so that the mask and wafer are out of contact;
    ejecting a pressurized gas onto the central portion of the surface of the wafer opposite to the mask while substantially preventing relative movement between the mask holder and the wafer chuck;
    exhausting gas from between the mask and the wafer; and
    thereafter moving the mask holder and the wafer chuck relative to each other to bring the mask and wafer into intimate contact with each other.

* * * * *

UNITED STATES PATENT AND TRADEMARK OFFICE
CERTIFICATE OF CORRECTION

PATENT NO. : 4,576,475

DATED : March 18, 1986

INVENTOR(S) : TAKAHIRO KITAGAWA, ET AL.

It is certified that error appears in the above-identified patent and that said Letters Patent is hereby corrected as shown below:

Column 1, line 43, change "of intimacy" to --of the intimacy--; and
line 61, change "thereof. Leads" to --thereof. This leads--.

Column 2, line 2, change "afore-mentioned" to --aforementioned--; and
line 65, change "now shown." to --not shown.--.

Column 3, line 68, change "vertially" to --vertically--

Column 4, line 39, change "vacuum-created" to --vacuum created--; and
line 53, change "11' the" to --11' by the vacuum 20 through conduit 14 and valve 16. The--.

Column 5, line 18, change "departing the" to --departing from the--.

Signed and Sealed this

Twenty-third Day of December, 1986

*Attest:*

DONALD J. QUIGG

*Attesting Officer*      *Commissioner of Patents and Trademarks*